United States Patent [19]

Ikshizaka et al.

[11] Patent Number: 5,198,837
[45] Date of Patent: Mar. 30, 1993

[54] LASER BEAM HARMONICS GENERATOR AND LIGHT EXPOSING DEVICE

[75] Inventors: Shoji Ikshizaka; Hideo Hara, both of Kawasaki; Yutaka Ichihara, Yokohama, all of Japan

[73] Assignee: Nikon Corporation, Tokyo, Japan

[21] Appl. No.: 635,679

[22] Filed: Dec. 28, 1990

[30] Foreign Application Priority Data

Jan. 10, 1990 [JP] Japan ................................. 2-3220

[51] Int. Cl.⁵ ............................................. H04N 1/21
[52] U.S. Cl. ................................. 346/108; 372/18; 372/22
[58] Field of Search ............ 346/107 R, 108; 372/18, 372/21, 22

[56] References Cited

U.S. PATENT DOCUMENTS

| | | | |
|---|---|---|---|
| 4,408,329 | 10/1983 | Ferguson | 372/21 |
| 4,851,978 | 7/1989 | Ichihara | 362/268 |
| 4,914,658 | 4/1990 | Stankov et al. | 372/18 |
| 4,964,720 | 10/1990 | Torigoe | 353/122 |

*Primary Examiner*—Mark J. Reinhart
*Attorney, Agent, or Firm*—Shapiro and Shapiro

[57] ABSTRACT

A laser beam harmonics generator comprises a laser beam source for emitting a laser beam, a harmonics generator for generating harmonics of the laser beam in response to the irradiation of the laser beam, and a displacement unit for relatively displacing the harmonics generator and the laser beam substantially perpendicular to a light path of the laser beam.

10 Claims, 4 Drawing Sheets

LASER BEAM HARMONICS GENERATOR AND LIGHT EXPOSING DEVICE

BACKGROUND OF THE INVENTION

1. Field of the Invention

The present invention relates to a laser beam harmonics generator and a light exposing device.

2. Related Background Art

An ultra-high pressure mercury lamp has been primarily used as a light source of a light exposing device which is used in manufacturing a semiconductor device.

However, recently the semiconductor device is more and more highly integrated and finely fabricated and an optical exposing system has been expanding its application area more and more as a high resolution power lens was developed. In this type of light exposing device, when a mask or reticle circuit pattern is to be transferred and formed on a wafer, a resolution line width of the circuit pattern formed on the wafer is proportional to a wavelength of an exposing light. Accordingly, recently a KrF excimer laser is used in place of the ultra-high pressure mercury lamp. The utilization of a harmonic light produced by radiating a pulse laser, such as a metal vapor laser, onto a material which generates a harmonic, such as a non-linear optical crystal, has been studied.

However, it has been found that a light exposing device which uses the excimer laser has many problems. For example, in a stable resonator type excimer laser, spectrum width is as wide as $\Delta\lambda=0.4$ nm (that is, a monochrominance property is poor). Thus, where a monochromatic lens consisting of silica is used as a projecting optical system, it is necessary to narrow the wavelength. Common problems with the excimer laser, include short durability and difficulty of maintenance due to the use of noxious gas such as fluorine.

In order to avoid the above problems, the harmonics of the pulse laser have been studied. In order to generate a second harmonic wave, a single crystal of a dielectric material without inversion symmetry (such as non-linear optical crystal) is used. In order to generate the second harmonic wave from the single crystal of the dielectric material without the inversion symmetry, it is necessary to meet a phase matching condition 1 in which refractive indices of the crystal for a fundamental wave and the second harmonic wave are equal. To this end, the laser beam must be applied at a specific angle. If the phase matching condition is not met, efficiency of generation of the harmonics is lowered. Further, in order to improve the efficiency of generation of the second harmonic wave, it is necessary to increase energy density per unit area of the laser beam. However, the more the laser beam is focused in the crystal, the more does the crystal absorb the laser beam and a temperature distribution (temperature gradient) in the crystal becomes abrupt because of the heat generated by the absorption. Since the refractive index of the crystal is changed by the change of temperature, the phase matching condition is no longer met. Further, the higher the power applied to the laser beam per unit area of the crystal and per unit time, the shorter the durability of the crystal. In addition, since the second harmonic wave generated from the laser beam has a high coherency, an undesired interference pattern such as speckle or interference fringe occurs.

SUMMARY OF THE INVENTION

It is an object of the present invention to provide a high efficiency and long durability harmonics generator which generates stable harmonics.

In order to solve the above problems, the harmonics generator of the present invention has a laser beam source 1 and a non-linear optical crystal 4 for generating harmonics of a laser beam LB, and the laser beam LB is directed to the non-linear optical crystal 4 to generate the harmonics of the laser beam LB. A vibration mirror 2 or a plane-parallel glass plate 15 and a vibrator 16 are provided to relatively move the non-linear optical crystal 4 and the laser beam LB substantially perpendicularly to a light path of the laser beam LB.

A light exposing device of the present invention has a laser beam source 1, a non-linear optical crystal 4 for generating harmonics of a laser beam LB, and a fly eye lens 6 which serves as illumination distribution unifying means. The harmonics are irradiated to a mask 12 through the fly eye lens 6 to expose a pattern of the mask onto a wafer 14. A vibration mirror 2 or a plane-parallel glass plate 15 and a vibrator 16 are provided between the laser beam source 1 and the non-linear optical crystal 4 to relatively move the pass area of the laser beam LB passing through the non-linear optical crystal 4 substantially perpendicularly to a light path of the laser beam LB during the exposure of the wafer 14.

The range S of movement of the pass area of the laser beam LB passing through the non-linear optical crystal 4 by the vibration mirror 2 or the plane-parallel glass plate 15 and the vibrator 16 is given by $S = m \cdot (R\lambda/d)$, $(m=1, 2, 3, \ldots)$ where R is a distance from a focusing point of the laser beam LB in the non-linear optical crystal 4 to the fly eye lens 6, d is an interval between optical elements of the fly eye lens 6 and $\lambda$ is a wavelength of the harmonic wave. The range of movement of the laser beam LB passing through the fly eye lens 6 is defined to impart a phase difference $2 m\pi$ between the light beams from the adjacent secondary light sources formed by the optical elements of the fly eye lens 6.

In the present invention, the laser beam LB and the non-linear optical crystal 4 are relatively moved substantially perpendicular to the light path of the laser beam LB so that the heat generated by the absorption of the laser beam LB and the harmonics of the laser beam LB by the crystal 4 is even and the temperature distribution in the crystal 4 is not abrupt. Accordingly, the change of the refractive index of the crystal 4 due to the change of the temperature does not occur, and the phase matching condition is met and the efficiency of generation of the harmonics is improved. Further, since the intensity of the laser beam LB irradiating the unit area of the crystal 4 per unit time is remarkably reduced, the durability of the crystal 4 is extended.

The range S of movement of the relative position of the laser beam LB and the crystal 4 is defined by $S = m \cdot (R\lambda/d)$ $(m=1, 2, 3, \ldots)$ where R is the distance from the focusing point of the laser beam LB in the crystal 4 to the fly eye lens 6, d is the interval between the lens elements of the fly eye lens 6 and $\lambda$ is the wavelength of the harmonic wave. The range of movement of the laser beam LB passing through the fly eye lens 6 is defined to impart the phase difference $2 m\pi$ between the light beam from the adjacent secondary light sources formed by the fly eye lens 6. Thus, the undesired patterns caused by the interference of the light beams from the secondary light sources are averaged.

DETAILED DESCRIPTION OF THE PREFERRED EMBODIMENTS

Figure 1:
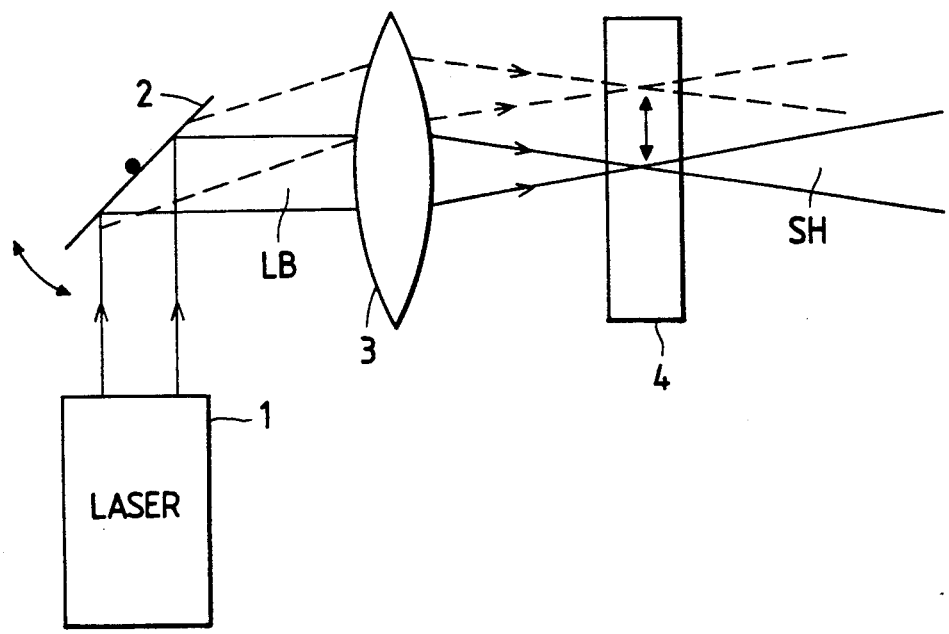
FIG. 1 shows a harmonics generator in accordance with a first embodiment of the present invention.

FIG. 1 shows a harmonics generator in accordance with a first embodiment of the present invention. A laser beam LB emitted from a copper vapor laser 1 is shaped to have a predetermined sectional area by a beam expander (not shown) and then deflected by a vibration mirror 2 such as a galvanometer which vibrates in a plane parallel to the sheet of the drawing. The deflected laser beam LB is focused by a group of lenses 3 and directed to a non-linear optical crystal ($\beta$-B$_a$B$_2$O$_4$ in the present embodiment). If the center of vibration of the vibration mirror 2 is set at a primary focal point of the group of lenses 3, the laser beam LB is vibrated parallel to the optical axis on the image side of the group of lenses 3 so that an incident angle of the laser beam LB directed to the non-linear optical crystal 4 is always substantially constant. For $\beta$-B$_a$B$_2$O$_4$. since an allowable angle error to meet the phase matching condition is 1 m rad, the above fact is important. Broken lines in FIG. 1 show a case where the laser beam LB is obliquely directed to the optical axis of the lens 3.

A light exposing device which uses the harmonics generator of the first embodiment of the present invention is now explained with reference to FIG. 3. The like elements to those shown in FIG. 1 are designated by the like numerals. A harmonic light SH generated by the crystal 4 is collimated by a lens system 5 and directed to a fly eye lens 6. Harmonic light beams from the respective element lenses of the fly eye lens 6 are superimposed on a reticle blind 8 by a lens system 7 and directed to a dichroic mirror 10 through a lens system 9. The dichroic mirror 10 reflects only the harmonic light and transmits light having other wavelengths. As a result, only the harmonic light irradiates a reticle 12 through a condenser lens 11 with a uniform illumination distribution so that a reticle pattern is projected and exposed onto a wafer 14 by a double-side or single-side telecentric projection lens 13. An origin point of the vibration of the vibration mirror 2 and the incident plane of the fly eye lens 6 are conjugate by the lens systems 3 and 5, and the exit plane (secondary light source) of the fly eye lens 6 and the pupil (incident pupil) plane E$_p$ of the projection lens 13 are conjugate. The reticle blind 8 and the recticle 12 are conjugate by the lens system 9 and the condenser lens 11. The laser beam LB is vibrated in the crystal 4 within the range of m·(R$\lambda$/d) (m=1, 2, 3, ...) where R is a distance from a focusing point in the crystal 4 to the fly eye lens 6, d is an interval between the lens elements of the fly eye lens 6, and $\lambda$ is a wavelength of the harmonic wave so that undesired interference fringes which are created on the reticle or the wafer by the interference of the light beams from the secondary light sources of the respective element lenses formed on the exit side of the fly eye lens 6 is reduced. This is described, for example, in U.S. Pat. No. 4,851,978.

Figure 2:
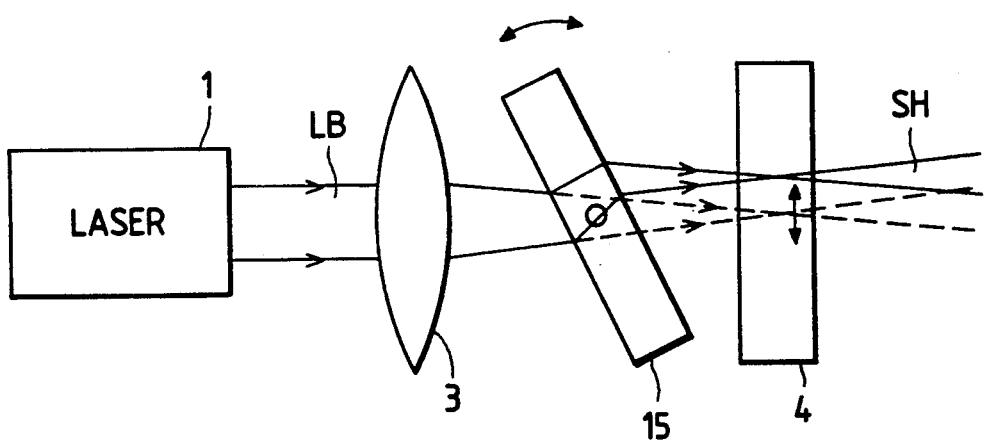
FIG. 2 shows a harmonics generator in accordance with a second embodiment of the present invention.

FIG. 2 shows a harmonics generator in accordance with a second embodiment of the present invention. In the present embodiment, a tiltable plane-parallel glass plate 15 is provided in place of the vibration mirror 2 of the harmonics generator of the first embodiment. The lens system 3 is arranged on the side of the plane-parallel glass plate 15 facing the light source so that the laser beam LB is focused into the crystal 4 and displaced parallel to the optical axis. As a result, the incident angle of the laser beam LB directed to the crystal 4 is always substantially constant and the phase matching condition is met.

Figure 3:
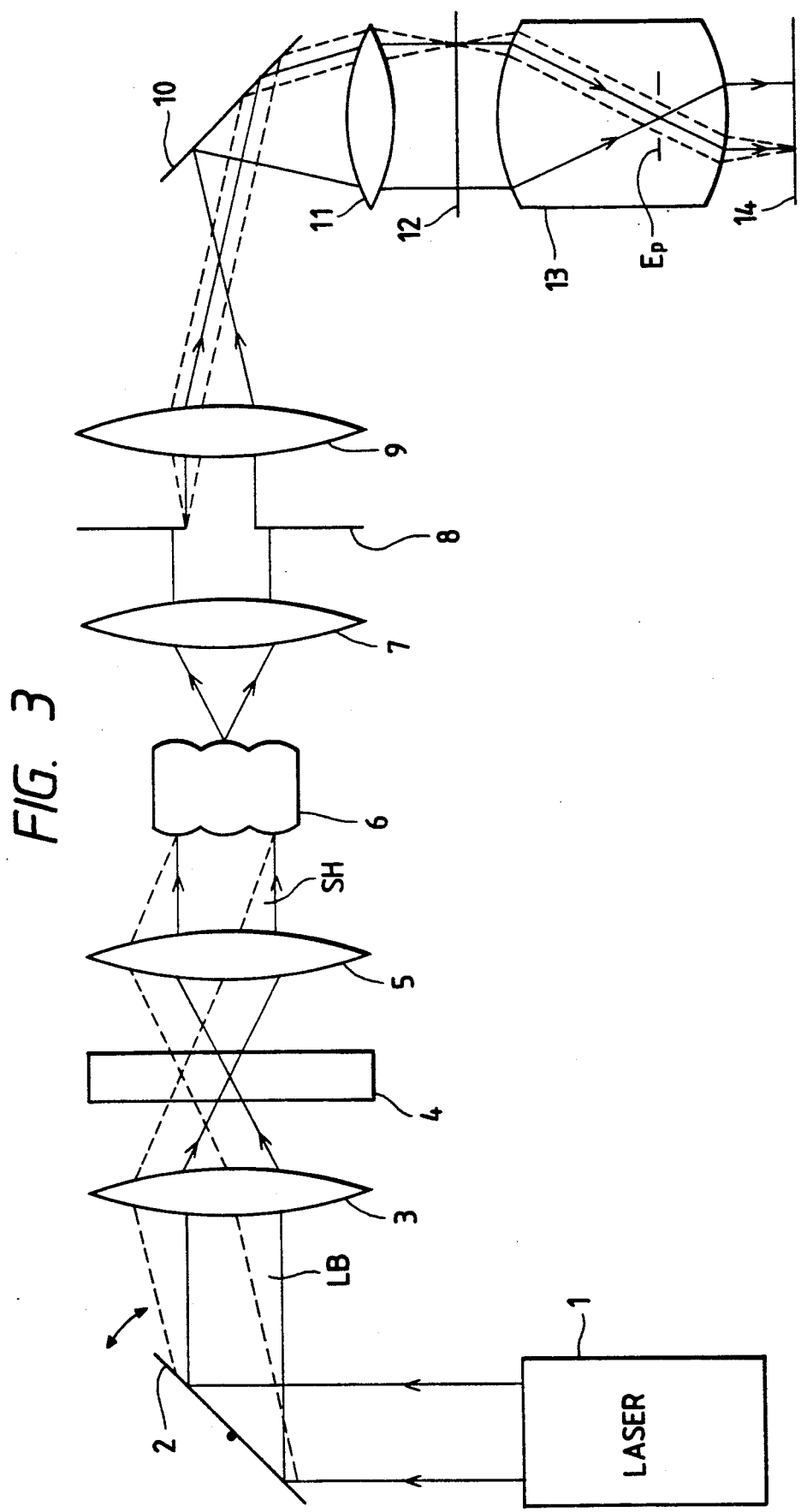
FIG. 3 shows a light exposing device which uses the harmonics generator of the first embodiment.

When the present harmonics generator is applied to a light exposing device, the construction after the crystal 4 may be identical to that of FIG. 3.

Figure 4:
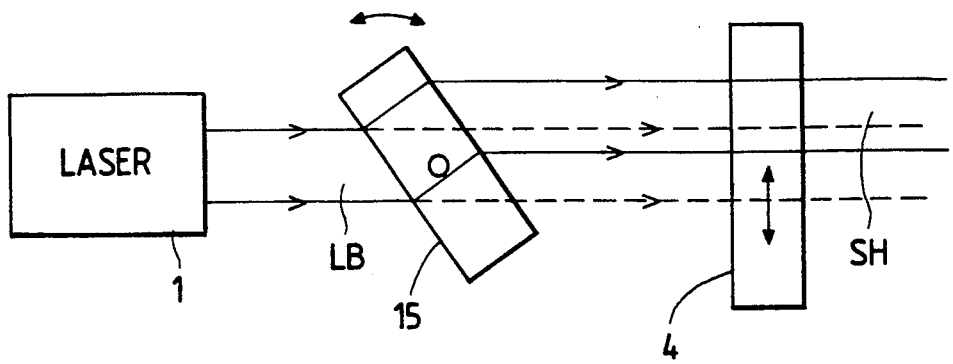
FIG. 4 shows a harmonics generator in accordance with a third embodiment of the present invention.
Figure 5:
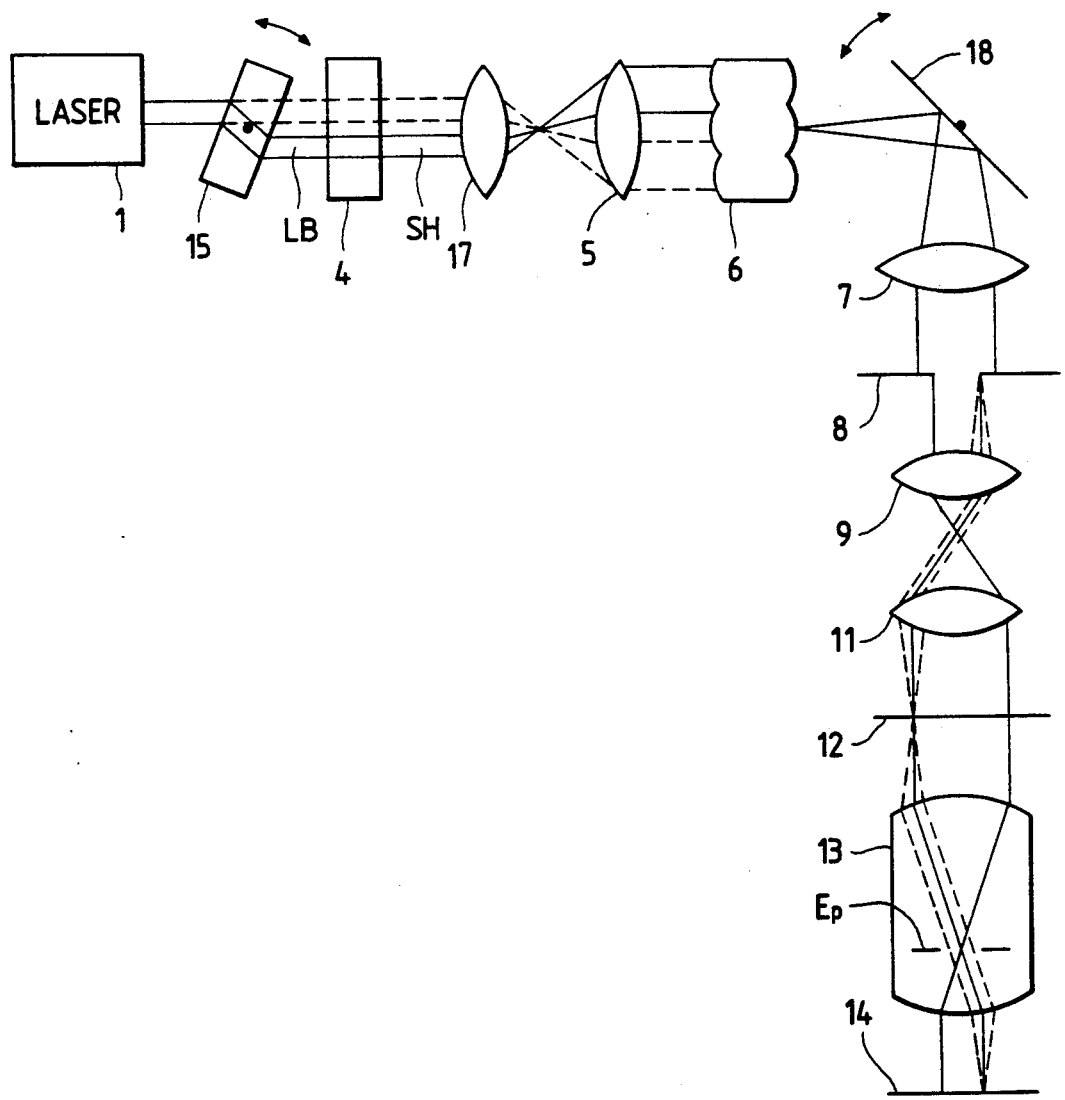
FIG. 5 shows a light exposing device which uses the harmonics generator of the third embodiment.

A third embodiment of the harmonics generator of the present invention is now explained with reference to FIG. 4. The laser beam LB emitted from the laser 1 is directed to a rotatable plane-parallel glass-plate 15 and then to the crystal 4. By rotating the plane parallel 15, the laser beam LB is vibrated parallel to the optical axis. The vibrating laser beam is directed to the non-linear optical crystal 4 to generate the harmonics. A light exposing device which uses the present harmonics generator is shown in FIG. 5. The harmonic wave SH generated by the crystal 4 is focused by a lens system 17, shaped to a substantially collimated beam having a predetermined sectional area by the lens system 5 and directed to the fly eye lens 6 while it vibrates parallel to the optical axis. A secondary focal point of the lens system 17 and a primary focal point of the lens system 5 substantially coincide. If the light from the secondary light source formed by the fly eye lens 6 is directly directed to the lens system 7, a stationary interference fringe is generated on the reticle blind 8. Therefore, a vibration mirror 18 is provided between the lens system 7 and the reticle blind 8. The range of vibration of the vibration mirror 18 corresponds to the movement of an integer multiple (including unity) of a pitch of the interference fringe. It is vibrated for a one-half period by a plurality of pulses necessary to attain a desired exposure.

Figure 6:
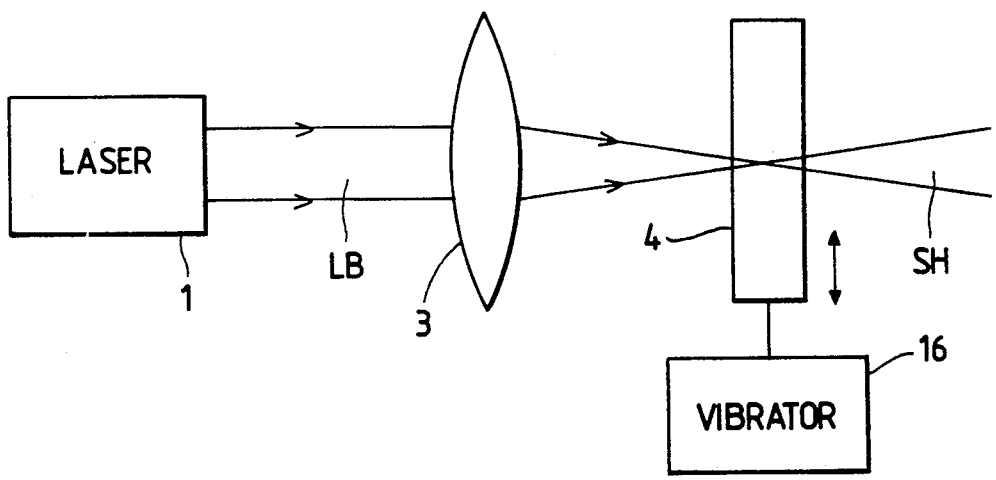
FIG. 6 shows a harmonics generator in accordance with a fourth embodiment of the present invention.

FIG. 6 shows a harmonics generator in accordance with a fourth embodiment of the present invention. A laser beam LB emitted by a copper vapor laser 1 is shaped to have a predetermined sectional area by a beam expander (not shown), focused by the group of lenses 3 without vibration by a reflection mirror, and directed to the nonlinear optical crystal 4. In order to avoid abrupt temperature distribution in the crystal 4, a vibrator 16 is provided to vibrate the crystal 4 substantially perpendicular to the optical axis to sequentially change the pass area of the laser beam LB passing through the crystal 4.

When the harmonics generator of FIG. 6 is applied to a light exposing device, the construction after the fly eye lens 6 is the same as that of FIG. 5 but a lens system (not shown) is provided between the non-linear optical crystal 4 and the fly eye lens 6 in order to direct the harmonic wave SH parallel to the fly eye lens 6.

Figure 7:
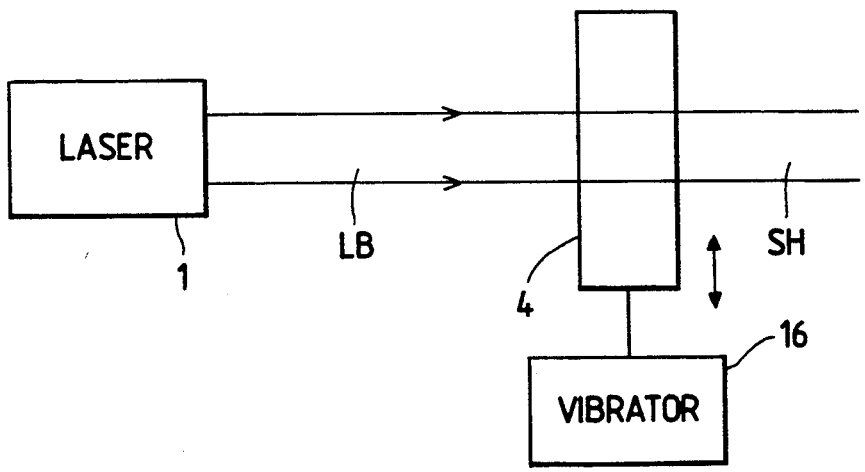
FIG. 7 shows a harmonics generator in accordance with a fifth embodiment of the present invention.

FIG. 7 shows a harmonics generator in accordance with a fifth embodiment of the present invention. The laser beam LB emitted by the laser beam source 1 is collimated by a beam expander (not shown) to have a predetermined sectional area, or directly directed to the non-linear optical crystal 4 from the laser beam source 1 without vibration, and converted to a substantially collimated harmonics light beam by the crystal 4. The crystal 4 is vibrated by the vibrator 16 substantially perpendicular to the optical axis of the laser beam as it is in FIG. 6 in order to prevent abrupt temperature distribution in the crystal 4. The phase matching condition of the crystal 4, that is, the range of change of the incident angle of the laser beam to the crystal 4 within 1 m rad, must be met. When the present harmonics generator is applied to a light exposing device, the construction after the fly eye lens 6 may be the same as that of FIG. 5.

In any embodiment, the drive of the vibration mirror 2, the plane-parallel glass plate 15 or the vibrator 16 is done in synchronism with the pulsation (trigger) of the laser beam source 1 and by a fine angle or fine distance for each pulse so that the pass area of the laser beam in the non-linear optical crystal is uniformly changed in time.

In accordance with the present invention, the non-linear optical crystal and the laser beam are relatively moved substantially perpendicular to the light path of the laser beam to meet the phase matching condition. Accordingly, the efficiency of generation of the harmonics is kept substantially constant and the durability of the non-linear optical crystal is extended. Where the harmonics generator is applied to a light exposing device, the laser beam is vibrated relative to the crystal so that the undesired interference pattern created on the reticle or wafer due to the spatial and time coherence of the harmonics is reduced (smoothed).

We claim:

1. A laser beam harmonics generator comprising:
   a laser beam source for emitting a laser beam;
   harmonics generation means for generating harmonics of the laser beam in response to the irradiation of the laser beam; and
   displacement means arranged between said laser beam source and said harmonics generation means for repetitively causing a relative displacement between said harmonics generation means and said laser beam perpendicular to a light path of the laser beam during emission of said laser beam from said laser beam source.

2. A laser beam harmonics generator according to claim 1 wherein said displacement means includes a light path displacement unit for displacing the light path of the laser beam substantially perpendicular to the light path.

3. A laser beam harmonics generator according to claim 2 wherein said light path displacement unit is a vibration mirror for reflecting the laser beam while finely vibrating.

4. A laser beam harmonics generator according to claim 2 wherein said light path displacement unit is a plane-parallel glass plate tiltable relative to the light path of the laser beam.

5. A laser beam harmonics generator according to claim 1 wherein said displacement means includes a vibrator for finely vibrating said harmonics generation means substantially perpendicular to the light path of the laser beam.

6. A light exposing device comprising:
   a laser beam source for emitting a laser beam;
   harmonics generation means for generating harmonics of the laser beam in response to irradiation of the laser beam;
   illumination distribution averaging means for transmitting an averaged illumination distribution of said harmonics;
   the averaged illumination distribution of the harmonics transmitted through said illumination distribution averaging means being irradiated to a mask to expose a pattern of said mask to a photosensitive substrate; and
   displacement means arranged between said laser beam source and said harmonics generation means for relatively displacing a pass area of the laser beam passing through said harmonics generation means substantially perpendicular to a light path of the laser beam repetitively during the exposure to said photosensitive substrate.

7. A light exposing device according to claim 6 wherein said displacement means includes a vibration device for finely vibrating said harmonics generation means substantially perpendicular to the light path of the laser beam.

8. A light exposing device according to claim 6 wherein a range S of displacement of the pass area of the laser beam displaced by said displacement means is given by $$S = m \cdot (R\lambda/d)$$

m: an integer no smaller than 1
wherein R is a distance between a focal plane of the laser beam in said harmonics generation means and said illumination distribution averaging means, d is an interval between optical elements of said illumination distribution averaging means and $\lambda$ is a wavelength of the harmonic wave, and
   the range of displacement is defined to impart a phase difference $2m\pi$ between light beam from adjacent secondary light sources formed by said illumination distribution averaging means.

9. A laser beam harmonics generator according to claim 1 wherein said harmonics generation means is a non-linear optical crystal.

10. A light exposing device according to claim 8, wherein said displacement means includes a vibration device for finely vibrating said harmonics generation means substantially perpendicular to the light path of the laser beam.

* * * * *

UNITED STATES PATENT AND TRADEMARK OFFICE
CERTIFICATE OF CORRECTION

PATENT NO. : 5,198,837
DATED : March 30, 1993
INVENTOR(S) : Shoji ISHIZAKA et al It is certified that error appears in the above-identified patent and that said Letters Patent is hereby corrected as shown below:

On the title page: Item

In [75] "Shoji Ikshizaka" should read --Shoji Ishizaka--.

Signed and Sealed this

Seventh Day of December, 1993

*Attest:*

BRUCE LEHMAN

*Attesting Officer*     *Commissioner of Patents and Trademarks*